(12) United States Patent
Joanna Chye et al.

(10) Patent No.: US 11,929,298 B2
(45) Date of Patent: Mar. 12, 2024

(54) MOLDED SEMICONDUCTOR PACKAGE WITH DUAL INTEGRATED HEAT SPREADERS

(71) Applicant: Infineon Technologies AG, Neubiberg (DE)

(72) Inventors: Jo Ean Joanna Chye, Penang (MY); Edward Fuergut, Dasing (DE); Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 500 days.

(21) Appl. No.: 17/097,098

(22) Filed: Nov. 13, 2020

(65) Prior Publication Data

US 2022/0157686 A1 May 19, 2022

(51) Int. Cl.
*H01L 23/367* (2006.01)
*H01L 21/56* (2006.01)
*H01L 23/31* (2006.01)
*H01L 23/46* (2006.01)
*H01L 23/495* (2006.01)

(52) U.S. Cl.
CPC ............ *H01L 23/367* (2013.01); *H01L 21/56* (2013.01); *H01L 23/3157* (2013.01); *H01L 23/46* (2013.01); *H01L 23/49568* (2013.01)

(58) Field of Classification Search
CPC ... H01L 21/56–568; H01L 23/28–3192; H01L 23/36–3738; H01L 23/4334; H01L 23/46–4735; H01L 23/495–49596
See application file for complete search history.

(56) References Cited

U.S. PATENT DOCUMENTS

| | | | |
|---|---|---|---|
| 5,430,331 | A | 7/1995 | Hamzehdoost et al. |
| 6,114,761 | A | 9/2000 | Mertol et al. |
| 2001/0002729 | A1 | 6/2001 | Wong et al. |
| 2004/0232545 | A1 | 11/2004 | Takaishi |
| 2005/0104197 | A1 | 5/2005 | Houle et al. |
| 2006/0055027 | A1 | 3/2006 | Kitabatake et al. |
| 2007/0139899 | A1 | 6/2007 | Van et al. |
| 2008/0054449 | A1 | 3/2008 | Hirler et al. |

(Continued)

FOREIGN PATENT DOCUMENTS

| | | |
|---|---|---|
| EP | 0352429 A2 | 1/1990 |
| EP | 3373331 A1 | 9/2018 |
| WO | 2012107755 A1 | 8/2012 |

*Primary Examiner* — Kimberly N Rizkallah
(74) *Attorney, Agent, or Firm* — Murphy, Bilak & Homiller, PLLC

(57) ABSTRACT

A molded semiconductor package includes: a semiconductor die embedded in a mold compound; a first heat spreader partly embedded in the mold compound and thermally coupled to a first side of the semiconductor die; and a second heat spreader partly embedded in the mold compound and thermally coupled to a second side of the semiconductor die opposite the first side. The first heat spreader includes at least one heat dissipative structure protruding from a side of the first heat spreader uncovered by the mold compound and facing away from the semiconductor die. The mold compound is configured to channel a fluid over the at least one heat dissipative structure in a direction parallel to the first side of the power semiconductor die. Corresponding methods of production and electronic assemblies are also described.

24 Claims, 11 Drawing Sheets

(56) References Cited

U.S. PATENT DOCUMENTS

| | | | |
|---|---|---|---|
| 2011/0316143 A1* | 12/2011 | Noritake | H01L 23/3107 |
| | | | 257/713 |
| 2013/0264702 A1* | 10/2013 | Nishi | H01L 23/3735 |
| | | | 257/712 |
| 2018/0301422 A1* | 10/2018 | Yamauchi | H01L 23/3114 |
| 2019/0371705 A1* | 12/2019 | Yamauchi | H01L 23/3675 |
| 2019/0393127 A1 | 12/2019 | Truhitte | |

* cited by examiner

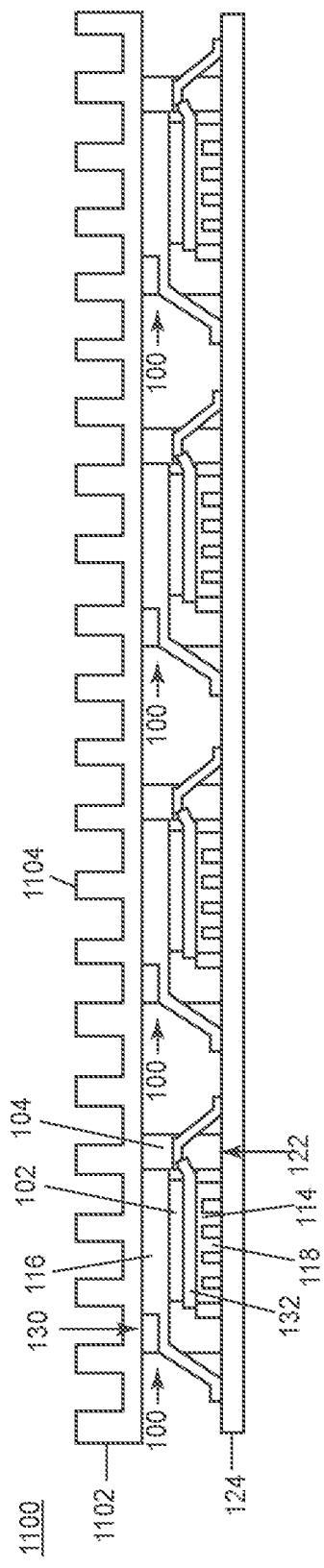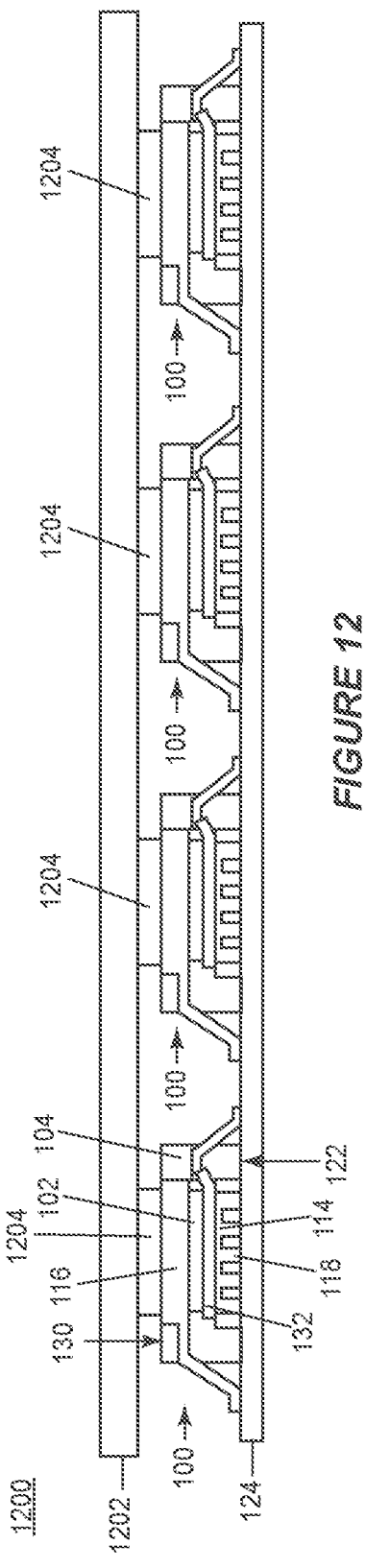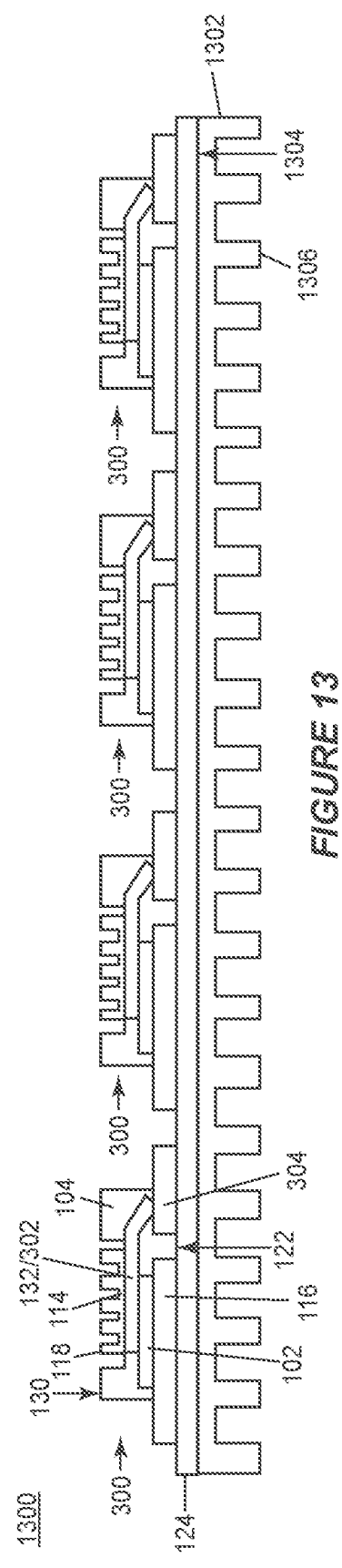

MOLDED SEMICONDUCTOR PACKAGE WITH DUAL INTEGRATED HEAT SPREADERS

BACKGROUND

With advancement in semiconductor chip (die) technology, packaging technology has become a limiting factor in achieving thermal and electrical performance. There is a need for better cooling efficiency while maintaining package size, since chip size continues to shrink but the requirement for better thermal performance increases. The size of a pad to which a semiconductor chip is attached within a package is typically increased to enlarge the heat dissipation area but is limited by package size and required creepage or clearance distance. This typically results in the customer having to use a larger external heat sink for secondary heat dissipation.

Thus, there is a need for an improved molded semiconductor package technology with increased cooling efficiency.

SUMMARY

According to an embodiment of a molded semiconductor package, the molded semiconductor package comprises: a semiconductor die embedded in a mold compound; a first heat spreader partly embedded in the mold compound and thermally coupled to a first side of the semiconductor die; and a second heat spreader partly embedded in the mold compound and thermally coupled to a second side of the semiconductor die opposite the first side, wherein the first heat spreader comprises at least one heat dissipative structure protruding from a side of the first heat spreader uncovered by the mold compound and facing away from the semiconductor die, wherein the mold compound is configured to channel a fluid over the at least one heat dissipative structure in a direction parallel to the first side of the power semiconductor die.

According to an embodiment of an electronic assembly, the electronic assembly comprises: a circuit board; a plurality of molded semiconductor packages each mounted at a bottom side to the circuit board, each molded semiconductor package comprising: a semiconductor die embedded in a mold compound; a first heat spreader partly embedded in the mold compound and thermally coupled to a first side of the semiconductor die; and a second heat spreader partly embedded in the mold compound and thermally coupled to a second side of the semiconductor die opposite the first side, wherein the first heat spreader comprises at least one heat dissipative structure protruding from a side of the first heat spreader uncovered by the mold compound and facing away from the semiconductor die, wherein the mold compound is configured to channel a fluid over the at least one heat dissipative structure in a direction parallel to the first side of the power semiconductor die.

According to an embodiment of a method of producing a molded semiconductor package, the method comprises: embedding a semiconductor die in a mold compound; thermally coupling a first heat spreader to a first side of the semiconductor die, the first heat spreader partly embedded in the mold compound; and thermally coupling a second heat spreader to a second side of the semiconductor die opposite the first side, the second heat spreader partly embedded in the mold compound, wherein the first heat spreader comprises at least one heat dissipative structure protruding from a side of the first heat spreader uncovered by the mold compound and facing away from the semiconductor die, wherein the mold compound is configured to channel a fluid over the at least one heat dissipative structure in a direction parallel to the first side of the power semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 11 illustrates a cross-sectional view of an embodiment of an electronic assembly that includes a plurality of the molded semiconductor packages shown in FIG. 1.

FIG. 12 illustrates a cross-sectional view of another embodiment of an electronic assembly that includes a plurality of the molded semiconductor packages shown in FIG. 1.

FIG. 13 illustrates a cross-sectional view of an embodiment of an electronic assembly that includes a plurality of the molded semiconductor packages shown in FIG. 3.

DETAILED DESCRIPTION

The embodiments described herein provide a molded semiconductor packaging technology having increased cooling efficiency. The molded semiconductor packaging technology includes a double-side heat spreader structure for dissipating heat at both sides of a molded semiconductor package. Corresponding methods of production and electronic assemblies are also described.

Described next, with reference to the figures, are exemplary embodiments of the molded semiconductor package technology having increased cooling efficiency and corresponding methods of production and electronic assemblies.

Figure 1:
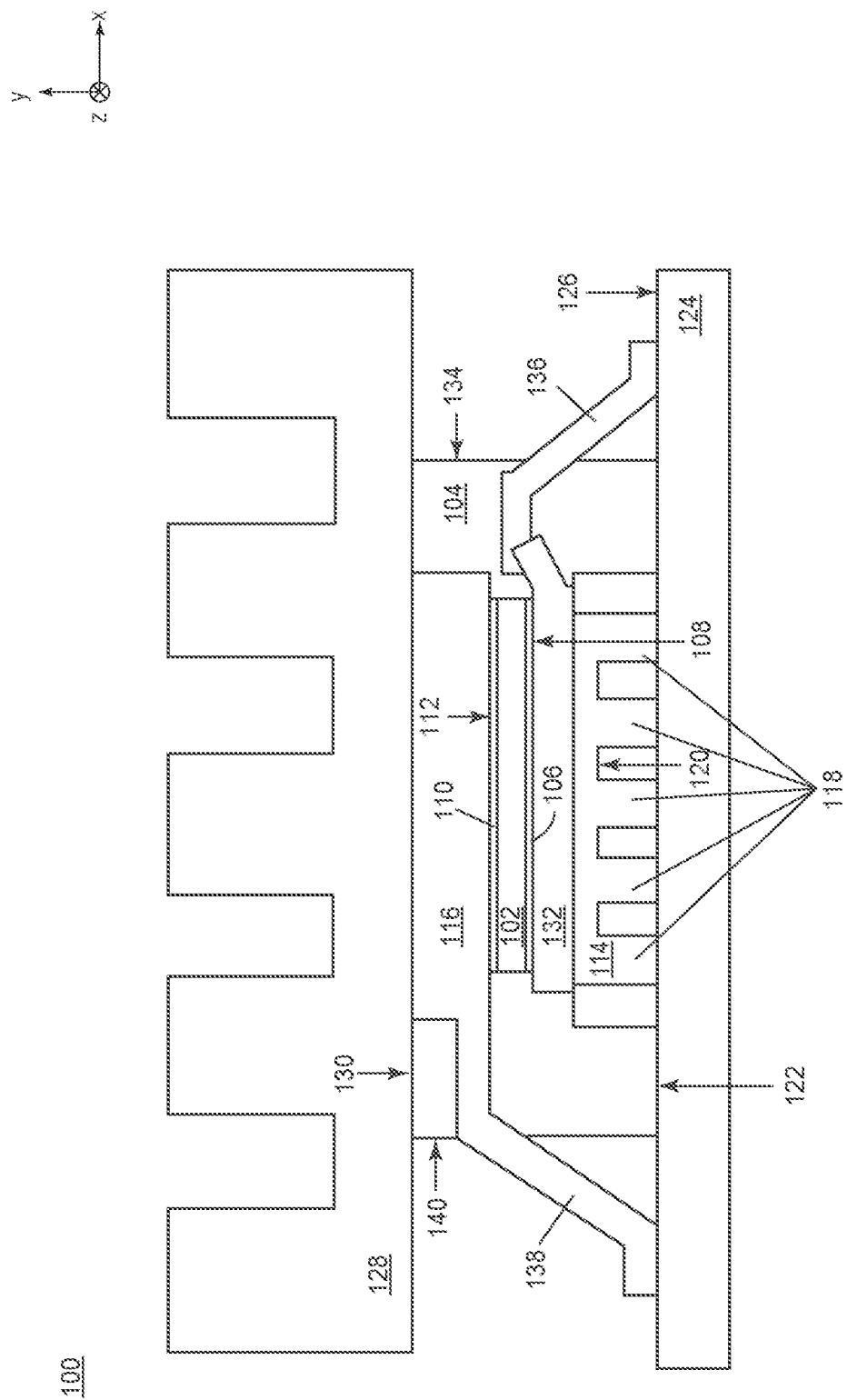
FIGS. 1 through 5 illustrate respective cross-sectional views of molded semiconductor packages, according to embodiments.

FIG. 1 illustrates a cross-sectional view of a molded semiconductor package 100. The molded semiconductor package 100 includes at least one semiconductor die 102 embedded in a mold compound 104. The semiconductor die 102 may be a logic die such as a processor die, memory die, etc., a power semiconductor die such as a power transistor die, a power diode die, a half bridge die, etc., or a die that combines logic and power devices on the same semiconductor substrate. In one embodiment, the semiconductor die 102 is a vertical semiconductor die having a primary current path between a first power contact pad 106 at a first side 108 of the semiconductor die 102 and a second power contact pad 110 at a second side 112 of the die 102 opposite the first side 108. Examples of vertical power semiconductor dies include but are not limited to power Si MOSFETs (metal-oxide-semiconductor field-effect transistors), IGBTs (insulated-gate bipolar transistors), SiC MOSFETs, wide bandgap devices such as those based on GaN technology, etc.

The molded semiconductor package 100 further includes a first heat spreader 114 partly embedded in the mold compound 104 and thermally coupled to the first side 108 of the semiconductor die 102, and a second heat spreader 116 partly embedded in the mold compound 104 and thermally coupled to the second side 112 of the semiconductor die 102. In the case of a vertical semiconductor die 102, the first heat spreader 114 may be thermally coupled to the first power contact pad 106 at the first side 108 of the vertical semiconductor die 102 and the second heat spreader 116 may be thermally coupled to the second power contact pad 110 at the second side 112 of the vertical semiconductor die 102.

In one embodiment, the first heat spreader 114 includes at least one heat dissipative structure 118 protruding from the side 120 of the first heat spreader 114 uncovered by the mold compound 104 and facing away from the semiconductor die 102. The mold compound 104 is configured to channel a fluid over each heat dissipative structure 118 in a direction (z direction in FIG. 1) parallel to the first side 108 of the semiconductor die 102. As used herein, the term 'fluid' means any substance that continually deforms/flows under an external force and includes liquids, gases, and plasmas.

As shown in FIG. 1, the molded semiconductor package 100 the first heat spreader 114 may be disposed at the bottom side 122 of the molded semiconductor package 100 and more than one heat dissipative structure 118 may protrude from the side 120 of the first heat spreader 114 uncovered by the mold compound 104 and facing away from the semiconductor die 102. The heat dissipative structures 118 of the first heat spreader 114 may terminate coplanar with the mold compound 104 at the bottom side 122 of the molded semiconductor package 100 and the bottom side 122 of the molded semiconductor package 100 may be configured for mounting to a circuit board 124 such as a printed circuit board (PCB), also as shown in FIG. 1. According to this embodiment, the heat dissipative structures 118 of the first heat spreader 114 do not vertically extend (direction y in FIG. 1) into a hole formed in the circuit board 124. Instead, the heat dissipative structures 118 of the first heat spreader 114 terminate at or before the package mounting side 126 of the circuit board 124. Since the mold compound 104 is structured or patterned to channel a fluid over each heat dissipative structure 118 of the first heat spreader 114, the first heat spreader 114 readily dissipates heat energy generated by the semiconductor die 102 into the surrounding environment. There may be a gap between the first heat spreader 114 and the mold compound 104 at the board mounting side 122 of the molded semiconductor package 100 to enable easy board assembly via a positive stand-off.

The molded semiconductor package 100 may also include a heat sink 128 attached to the second heat spreader 116. In this case, the second heat spreader 116 may be coplanar with the mold compound 104 at the top side 130 of the molded semiconductor package 100. The heat sink 128 attached to the second heat spreader 116 may be an air-cooled or liquid-cooled heat sink. The second heat spreader 116 may be electrically isolated from the heat sink 128, e.g., by a TIM (thermal interface material) such as an electrically insulative sheet, gap filler, etc.

By partly embedding a heat spreader 114, 116 in the mold compound 104 at both main sides 122, 130 of the molded semiconductor package 100, heat dissipation is provided at both sides 122, 130 of the package 100. Accordingly, the circuit board 124 to which the molded semiconductor package 100 is to be attached may or may not require an additional heat sink.

The molded semiconductor package 100 may also include a first electrical redistribution structure 132 such as a metal clip interposed between the first heat spreader 114 and the first power contact pad 106 of the semiconductor die 102 or formed as part of the first heat spreader 114. According to this embodiment, the first electrical redistribution structure 132 is separate from the first heat spreader 114 such that the first heat spreader 114 is attached to the first electrical redistribution structure 132 which in turn is attached to the first power contact pad 106 at the first side 108 of the semiconductor die 102. The first electrical redistribution structure protrudes from a side face 134 of the mold compound 104 or has one or more leads 134 that protrude from the side face 134 of the mold compound 104, and provides an electrical connection between the first power contact pad 106 of the semiconductor die 102 and the circuit board 124.

The molded semiconductor package 100 may also include a second electrical redistribution structure interposed between the second heat spreader 116 and the second power contact pad 110 of the semiconductor die 102 or formed as part of the second heat spreader 116. According to the embodiment shown in FIG. 1, the second electrical redistribution structure is formed as part of the second heat spreader 116 and has one or more metal leads 138 protruding from a side face 140 of the mold compound 104 to provide an electrical connection between the second power contact pad 110 at the second side 112 of the semiconductor die 102 and the circuit board 124.

Figure 2:
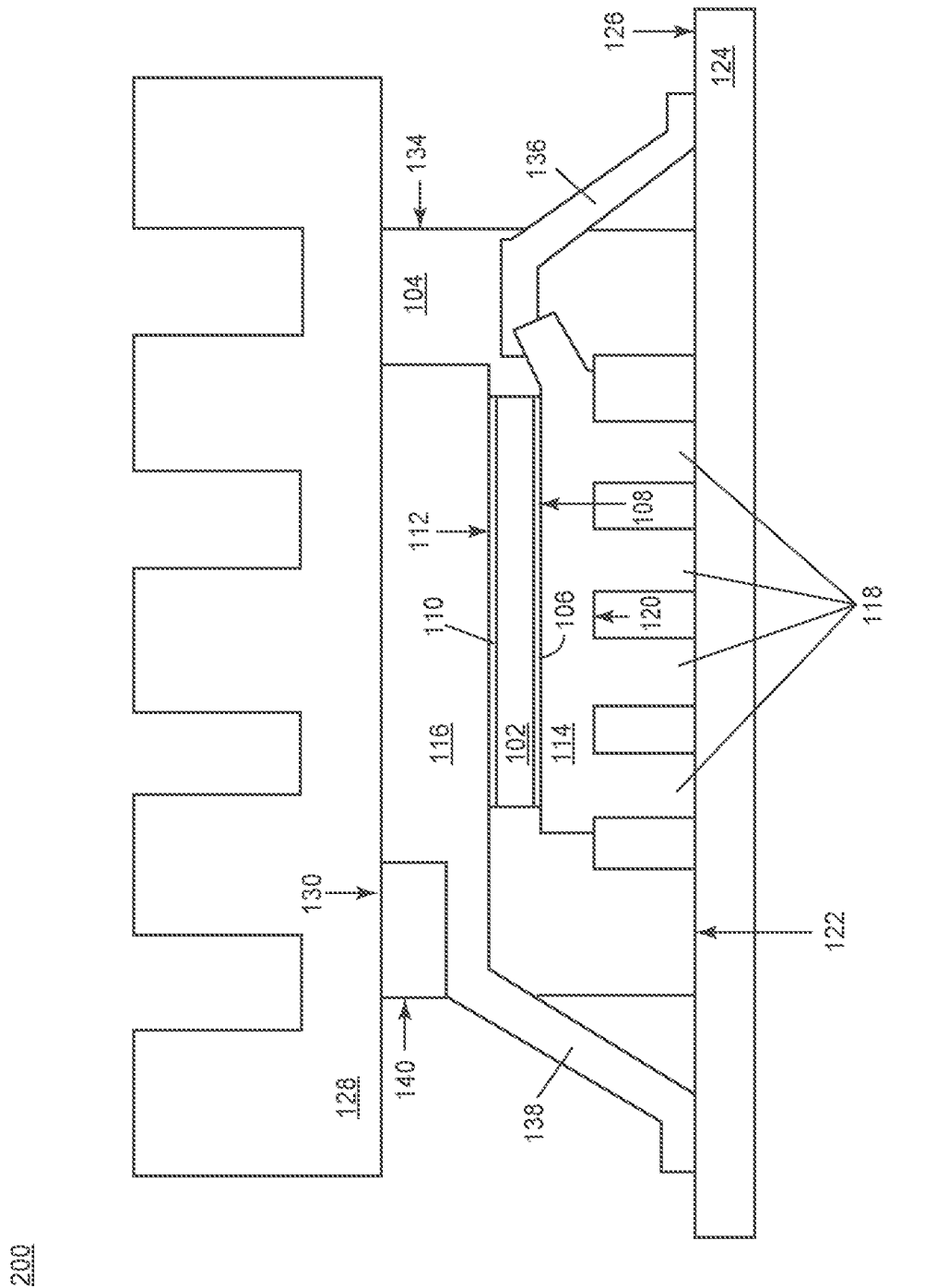

FIG. 2 illustrates a cross-sectional view of another embodiment of a molded semiconductor package 200. The embodiment shown in FIG. 2 is similar to the embodiment shown in FIG. 1. Different, however, the first electrical redistribution structure is formed as part of the first heat spreader 114. According to this embodiment, the first heat spreader 114 is attached to the first side 108 of the semiconductor die 102.

Figure 3:
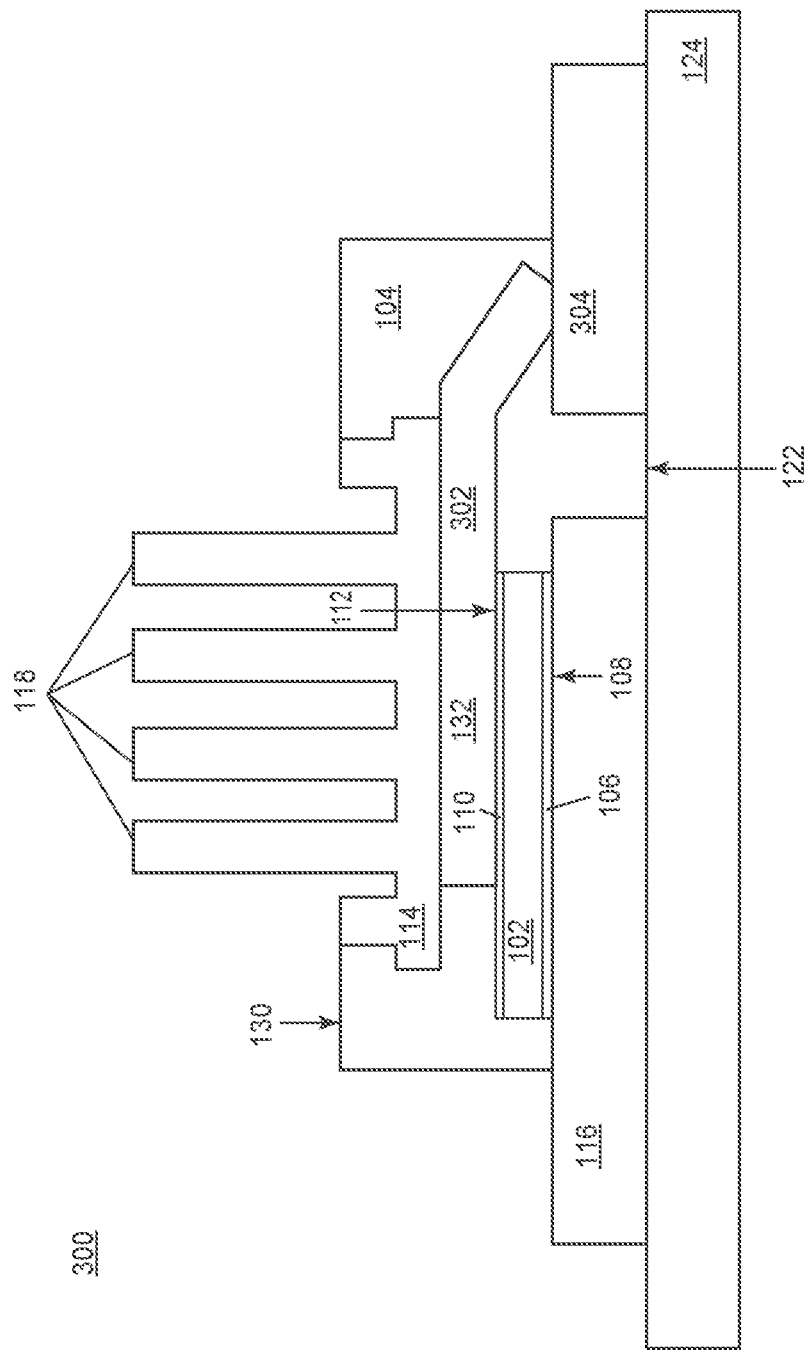

FIG. 3 illustrates a cross-sectional view of another embodiment of a molded semiconductor package 300. The embodiment shown in FIG. 3 is similar to the embodiment shown in FIG. 1. Different, however, the first heat spreader 114 is disposed at the top side 130 of the molded semiconductor package 300 opposite the bottom side 122 and the first electrical redistribution structure 132 is interposed between the first heat spreader 114 and the second power contact pad 110 at the second side 112 of the semiconductor die 102. In one embodiment, the first electrical redistribution structure 132 includes a metal clip 302 attached to a metal lead 304 at the bottom side 122 of the molded semiconductor package 300, and the bottom side 122 of the molded semiconductor package 300 being configured for mounting to a circuit board 124. Also different than the embodiment shown in FIG. 1, the heat dissipative structures 118 of the first heat spreader 114 extend beyond the mold compound 104 at the top side 130 of the molded semiconductor package 300.

Figure 4:
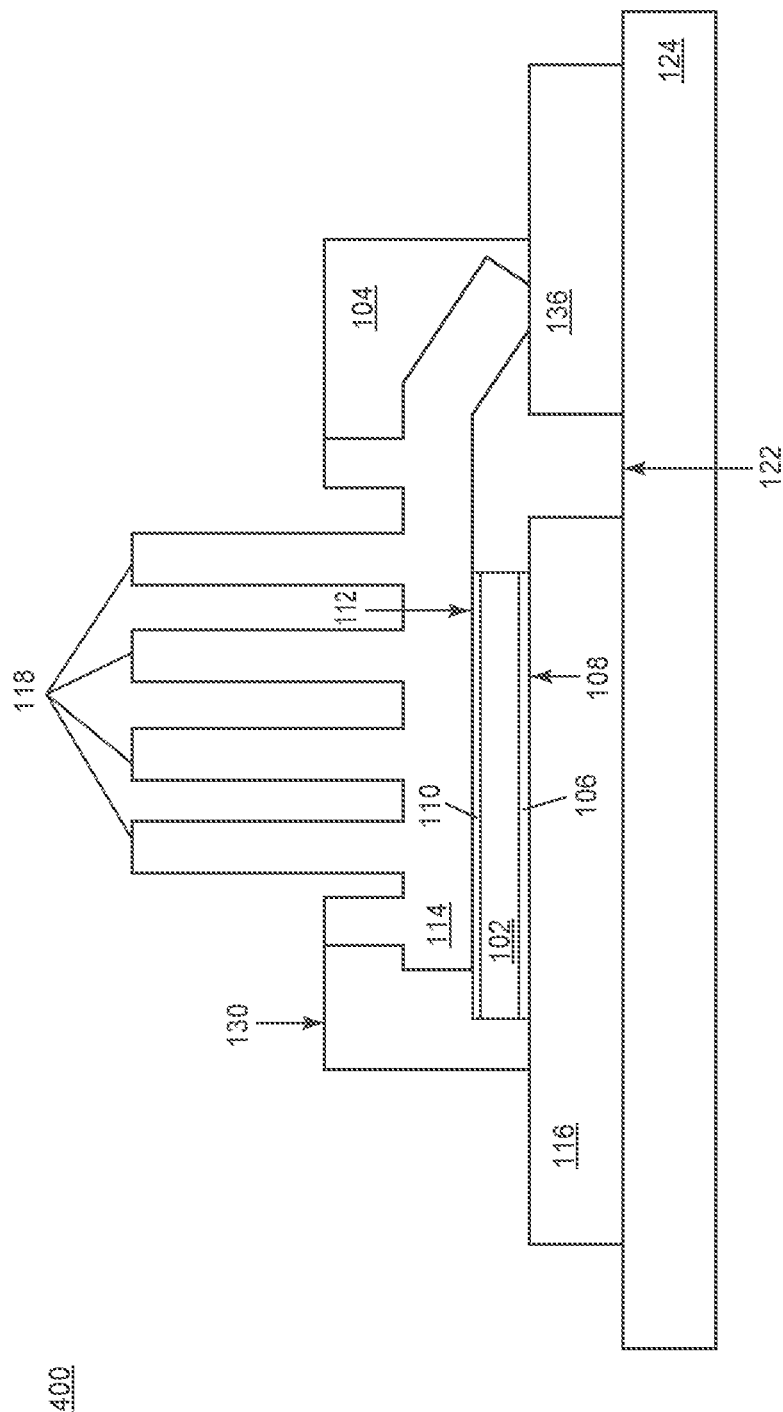

FIG. 4 illustrates a cross-sectional view of another embodiment of a molded semiconductor package 400. The embodiment shown in FIG. 4 is similar to the embodiment shown in FIG. 3. Different, however, the first electrical redistribution structure is formed as part of the first heat spreader 114. According to this embodiment, the first heat spreader 114 is attached to the second power contact pad 110 at the second side 112 of the semiconductor die 102.

Figure 5:
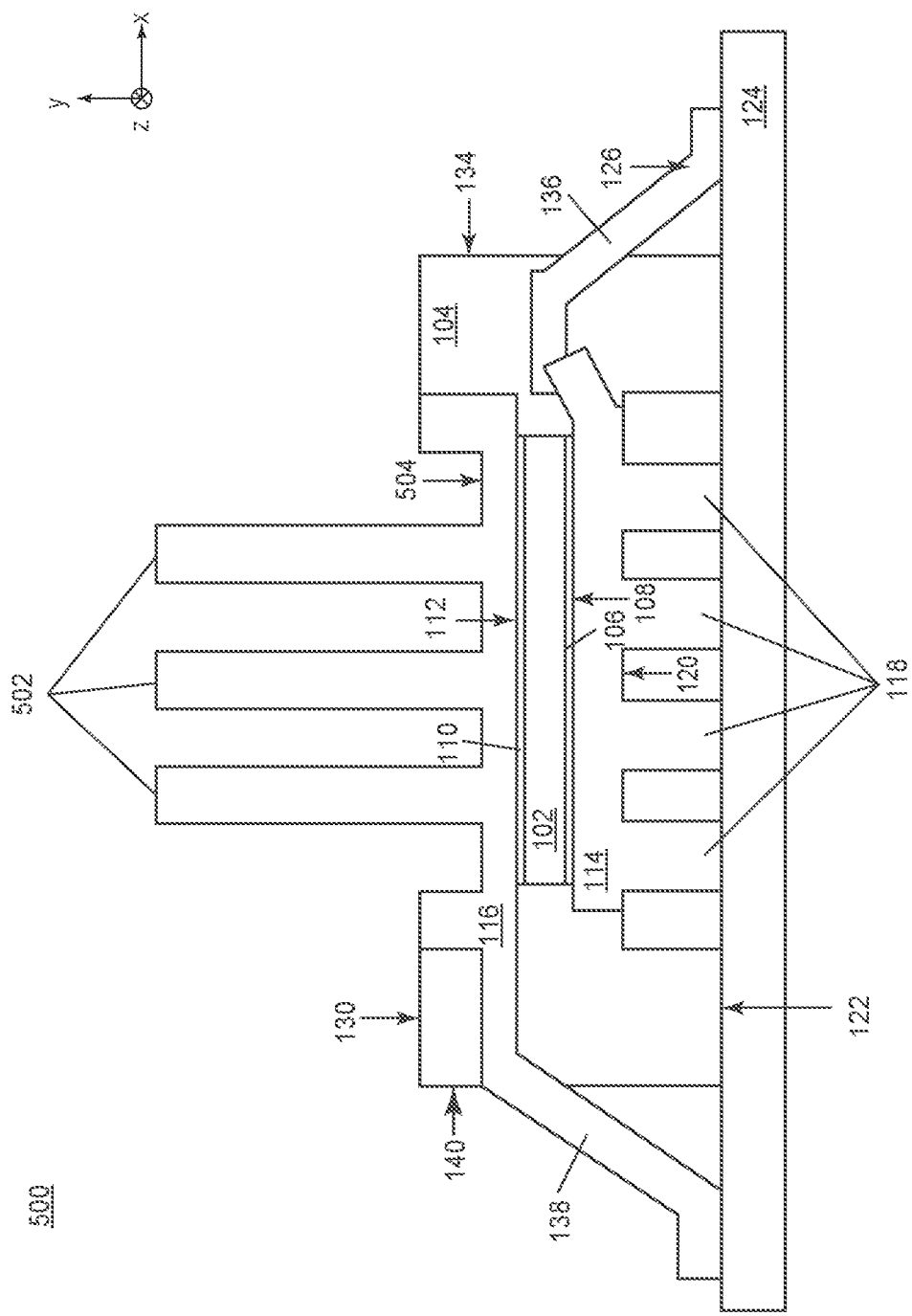

FIG. 5 illustrates a cross-sectional view of another embodiment of a molded semiconductor package 500. The embodiment shown in FIG. 5 is similar to the embodiment shown in FIG. 2. Different, however, the second heat spreader 116 also includes at least one heat dissipative structure 502 protruding from the side 504 of the second heat spreader 116 uncovered by the mold compound 104 and facing away from the semiconductor die 102 and the mold compound 104 is configured to channel a fluid over each heat dissipative structure 502 of the second heat spreader 116 in a direction (z direction in FIG. 5) parallel to the second side 112 of the semiconductor die 102.

Figure 6A:
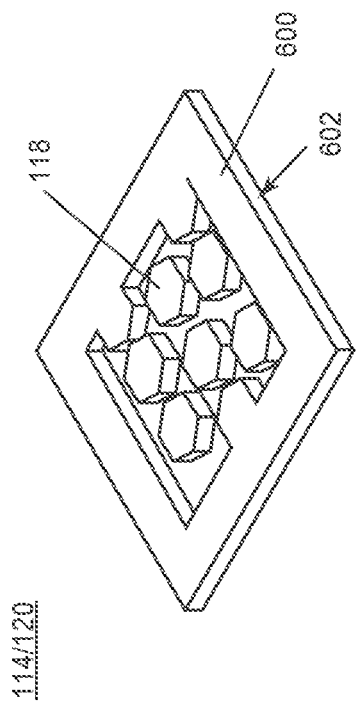
FIGS. 6A through 6D illustrate respective perspective views of a first heat spreader included in the molded semiconductor packages shown in FIGS. 1 through 5, according to embodiments.
Figure 6B:
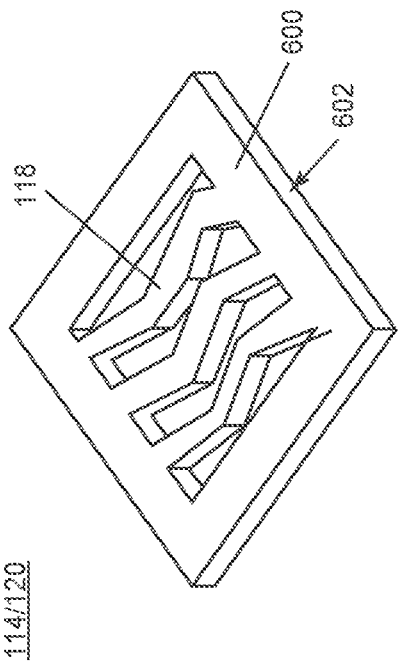
Figure 6C:
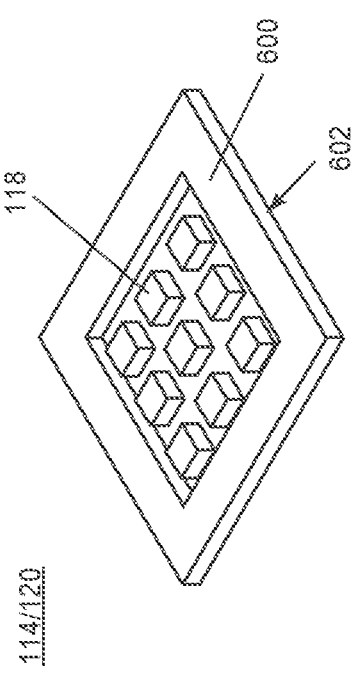
Figure 6D:
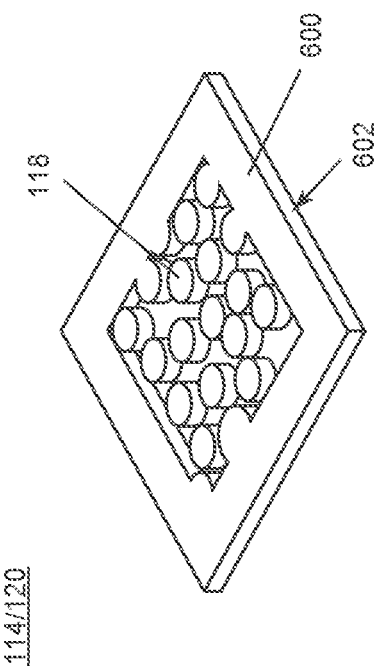

FIGS. 6A through 6D illustrate different embodiments of the heat dissipative structures 118 protruding from the side 120 of the first heat spreader 114 uncovered by the mold compound 104 and facing away from the semiconductor die 102. In each of FIGS. 6A through 6D, the first heat spreader 114 further comprises a (dam-like) wall structure 600 laterally surrounding the heat dissipative structures 118 along a periphery 602 of the side 120 of the first heat spreader 114 uncovered by the mold compound 104 and facing away from the semiconductor die 102. The heat dissipative structures 118 may have any shape such as but not limited to square (FIG. 6A), hexagonal (FIG. 6B), circular (FIG. 6C) and wavy or straight lines/stripes (FIG. 6D). The heat dissipative structures 118 may be arranged at regular intervals (e.g. FIGS. 6A and 6B) or irregular intervals (e.g. FIGS. 6C and 6D) and may have the same size (e.g. FIGS. 6A and 6B) or different sizes (e.g. FIGS. 6C and 6D).

In general, the structural design of the first heat spreader 114 may be scalable and flexible, e.g., in height, width, length and shape. The area of heat dissipation of the first heat spreader 114 may be ≥1.5 depending on the amount of desired exposed area, consequently reducing thermal resistance as given by:

$$R_{th\_spreader} = \rho \frac{l}{A} \quad (1)$$

where Rth_spreader is the thermal resistance of the first heat spreader 114, ρ is the thermal resistivity of the hear spreader material, l is the thickness of the first heat spreader 114, and A is the area of the first heat spreader 114 exposed from the mold compound 104.

The design of the second heat spreader 116 may have similar scalability and flexibility as the first heat spreader 114, especially if provided with heat dissipative structures 502.

The wall structure 600 of the first heat spreader 114 forms a barrier/step-up which may be at the same height (coplanar) as the mold compound 104 on all four sides of the first heat spreader 114 to prevent mold flow onto the back side 120 of the first heat spreader 114. Accordingly, the interior of the first heat spreader 114 which is laterally spaced inward from the periphery 602 remains exposed from the mold compound 104 to provide increased heat dissipation with more exposed metal surface area.

The first heat spreader 114 with the wall structure 600 laterally surrounding the heat dissipative structures 118 may be formed by etching, stamping, or otherwise patterning a metal or metal alloy. For example, a Cu sheet may be stamped and/or etched to batch form a plurality of first heat spreaders 114 each having a wall structure 600 laterally surrounding heat dissipative structures 118.

Figure 7A:
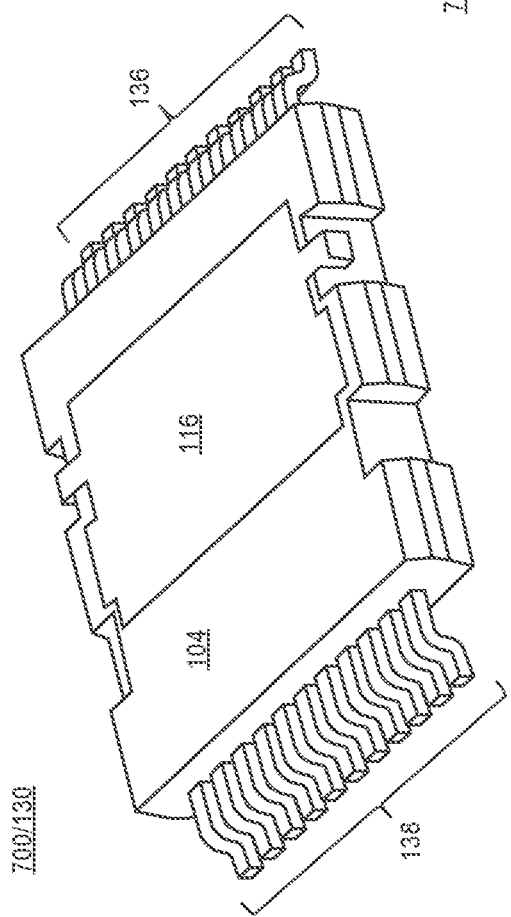
FIG. 7A illustrates a top perspective view and FIG. 7B illustrates a bottom perspective view of an embodiment of a molded semiconductor package that includes a first heat spreader with the heat dissipative structures shown in FIG. 6A.
Figure 7B:
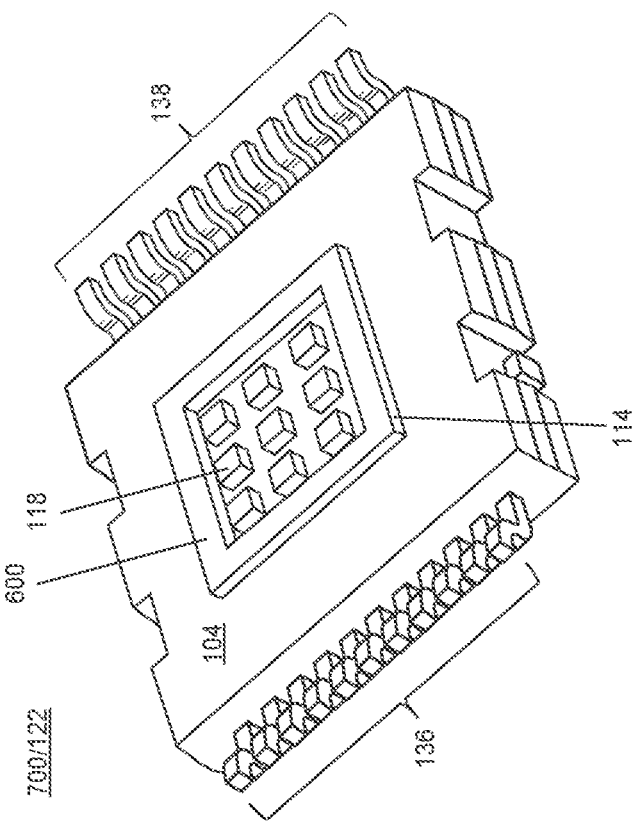

FIGS. 7A and 7B illustrate different perspective views of an embodiment of a molded semiconductor package 700 that includes the first heat spreader 114 with the heat dissipative structures 118 shown in FIG. 6A. FIG. 7A shows the top side 130 of the package 700 and FIG. 7B shows the bottom side 122 of the package 700. As shown in FIG. 7B, the first heat spreader 114 is disposed at the bottom side 122 of the molded semiconductor package 700 which may be configured for mounting to a circuit board (not shown in FIGS. 7A and 7B) such as a PCB, as previously explained herein. The wall structure 600 of the first heat spreader 114 may terminate coplanar with the mold compound 104 at the bottom side 122 of the molded semiconductor package 700.

Figure 8A:
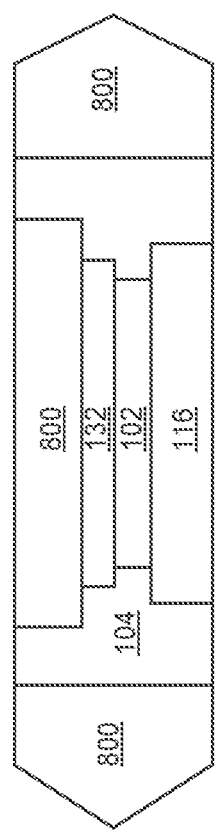
FIGS. 8A through 8C illustrate respective cross-sectional views during different stages of an embodiment of a method of producing the molded semiconductor packages shown in FIGS. 1 through 7B.
Figure 8B:
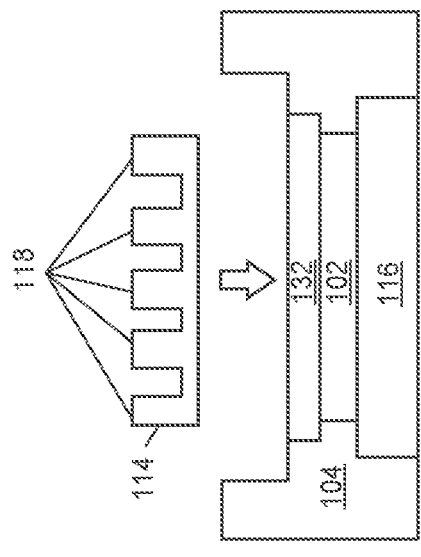
Figure 8C:
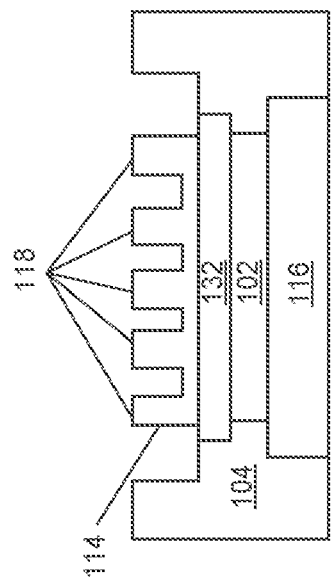

FIGS. 8A through 8C illustrate respective cross-sectional views during different stages of an embodiment of a method of producing the molded semiconductor packages shown in FIGS. 1 through 7B.

FIG. 8A shows at least one semiconductor die 102 embedded in a mold compound 104. Before the embedding, the semiconductor die 102 with the second heat spreader 116 is loaded into a mold cavity 800. An optional metal block, such as the first electrical redistribution structure 132, may be attached to the opposite side of the semiconductor die 102 as the second heat spreader 116. Liquified mold flows into the cavity 800 and surrounds the exposed parts of the semiconductor die 102 and the second heat spreader 116. The liquified mold is then cured to form the mold compound 104.

FIG. 8B shows the molded structure after removal from the mold cavity 800. After embedding the semiconductor die 102 in the mold compound 104, the first heat spreader 114 is placed in a cavity 802 formed in the mold compound 102.

FIG. 8C shows the first heat spreader 114 attached to the exposed side of the semiconductor die 102 or to the optional metal block (e.g. first electrical redistribution structure 132). The first heat spreader 114 may be attached using solder, a thermally conductive adhesive, etc. The heat dissipative structures 118 of the first heat spreader 114 may be coplanar with the mold compound 104 as shown in FIG. 8C or may extend beyond the mold compound 104, e.g. as shown in FIGS. 3 and 4.

Figure 9:
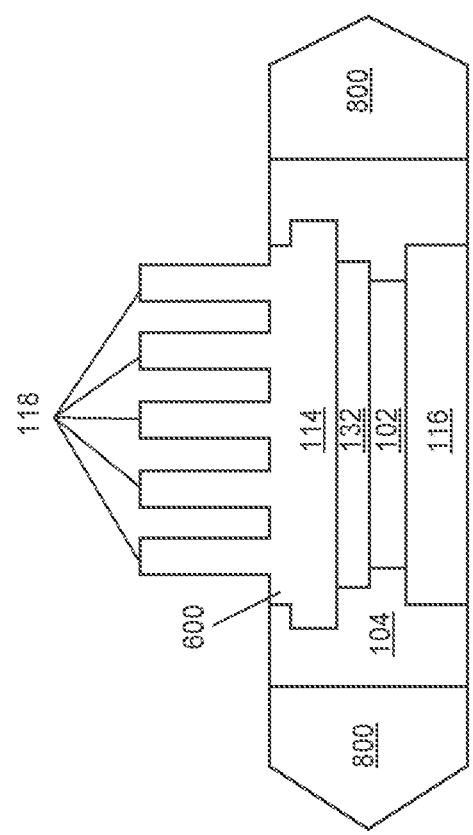
FIG. 9 illustrates a cross-sectional view of another embodiment of a method of producing the molded semiconductor packages shown in FIGS. 1 through 7B.

FIG. 9 illustrates a cross-sectional view of another embodiment of a method of producing the molded semiconductor packages shown in FIGS. 1 through 7B. Before embedding the semiconductor die 102 in the mold compound 104, the first heat spreader 114 is attached to the semiconductor die 102 or to a metal block such as the first electrical redistribution structure 132 which is attached to the semiconductor die 102. The first heat spreader 114 may be attached using solder, a thermally conductive adhesive, etc.

The first heat spreader 114 includes a wall structure 600 that laterally surrounds the heat dissipative structures 118, e.g., as previously described herein in connection with FIGS. 6A through 6D. The wall structure 600 prevents liquified mold compound from flowing over the heat dissipative structures 118 of the first heat spreader 114 during the embedding of the semiconductor die 102 in the mold compound 104.

Figure 10A:
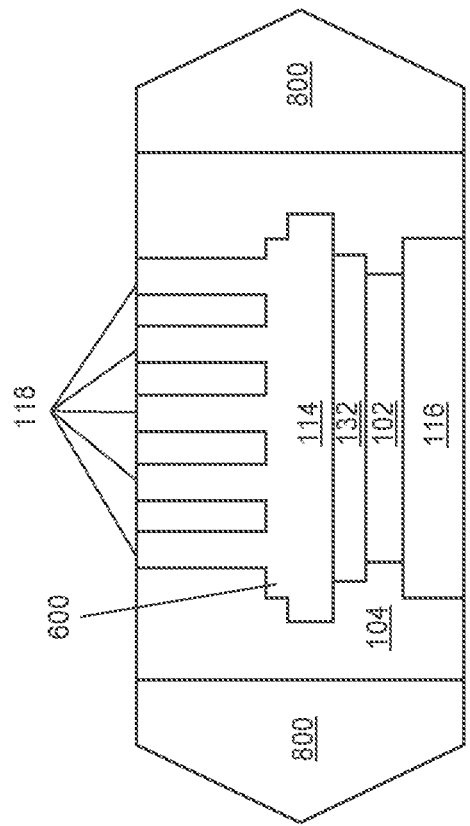
FIGS. 10A and 10B illustrate respective cross-sectional views during different stages of another embodiment of a method of producing the molded semiconductor packages shown in FIGS. 1 through 7B.
Figure 10B:
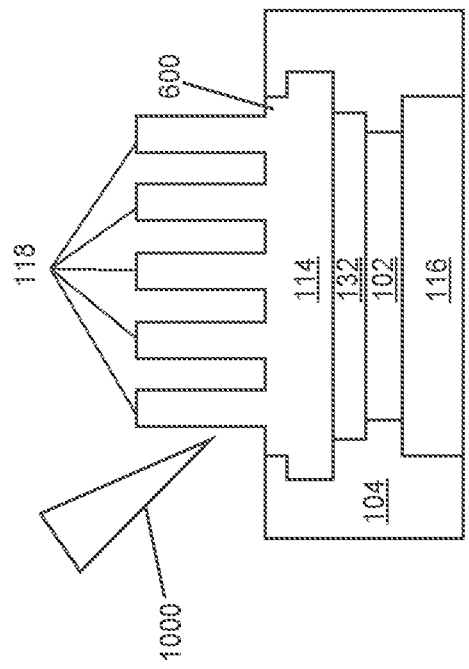

FIGS. 10A and 10B illustrate respective cross-sectional views during different stages of another embodiment of a method of producing the molded semiconductor packages shown in FIGS. 1 through 7B.

FIG. 10A shows at least one semiconductor die 102 embedded in a mold compound 104. Before the embedding, the first heat spreader 114 is attached to the semiconductor die 102 or to a metal block such as the first electrical redistribution structure 132 which is attached to the semiconductor die 102. The first heat spreader 114 may be attached using solder, a thermally conductive adhesive, etc.

FIG. 10B shows the molded structure after removal from the mold cavity 800. After embedding the semiconductor die 102 in the mold compound 104, the mold compound 104 is removed from the heat dissipative structures 118 of the first heat spreader 114. In one embodiment, the mold compound 104 is removed from the heat dissipative structures 118 of the first heat spreader 114 by laser etching 1000.

FIG. 11 illustrates a cross-sectional view of an embodiment of an electronic assembly 1100 that includes a plurality of the molded semiconductor packages 100 shown in FIG. 1, although the first electrical redistribution structure 132 may be omitted such that the first heat spreader 114 is attached to the corresponding semiconductor die 102. In either case, each first heat spreader 114 is disposed at the bottom side 122 of the corresponding molded semiconductor package 100 and faces the circuit board 124. Each second heat spreader 116 is disposed at the top side 130 of the corresponding molded semiconductor package 100 and faces away from the circuit board 124. A heat sink 1102 is attached to the second heat spreader 116 of each molded semiconductor package 100. The heat sink 1102 may have heat dissipation structures 1104 such as fins for increasing the heat dissipation surface area of the heat sink 102.

FIG. 12 illustrates a cross-sectional view of another embodiment of an electronic assembly 1200 that includes a plurality of the molded semiconductor packages 100 shown in FIG. 1. The embodiment shown in FIG. 12 is similar to the embodiment shown in FIG. 11. Different, however, the heat sink 1202 is a solid block without fins and is attached to the second heat spreader 116 of the respective molded packages 100 by corresponding metal blocks 1204.

In some embodiments, the metal blocks 1204 may be electrically connected to the second heat spreader 116, e.g., using solder. The metal blocks 1204 are electrically connected to the heat sink 1202. In such instances, the heat sink 1202 may perform a dual function as an electrical connector for multiple packages. The heat sink 1202 may be made of a thick block of metal such as copper, aluminium or other electrically conductive metal to provide for good electrical performance such as low inductance and high electrical conductivity.

In the embodiments illustrated in FIGS. 11 and 12, there may be a gap between the first heat spreader 114 and the mold compound 104 at the board mounting side 122 of the molded semiconductor package 100 to enable easy board assembly via a positive stand-off. Separately or in addition, the second heat spreader 116 may be electrically isolated from the heat sink 128, e.g., by a TIM (thermal interface material) such as an electrically insulative sheet, gap filler, etc.

FIG. 13 illustrates a cross-sectional view of an embodiment of an electronic assembly 1300 that includes a plurality of the molded semiconductor packages 300 shown in FIG. 3, although the first electrical redistribution structure 132 may be omitted as shown in FIG. 4 such that the first heat spreader 114 is attached to the corresponding semiconductor die 102. In either case, each second heat spreader 116 is disposed at the bottom side 122 of the corresponding molded semiconductor package 300 and faces the circuit board 124. Each first heat spreader 114 is disposed at the top side 130 of the corresponding molded semiconductor package 300 and faces away from the circuit board 124. For each molded semiconductor package 300, the heat dissipative structures 118 of the first heat spreader 114 may be coplanar with the mold compound 104 at the top side 130 of the molded semiconductor package 300 as shown in FIG. 13 or may instead may extend beyond the mold compound 104, e.g., as shown in FIG. 4. In either case, a heat sink 1302 is attached to the side 1304 of the circuit board 124 that faces away from the molded semiconductor packages 300. The heat sink 1302 may or may not have fins 1306 for increased heat dissipation area.

Although the present disclosure is not so limited, the following numbered examples demonstrate one or more aspects of the disclosure.

Example 1. A molded semiconductor package, comprising: a semiconductor die embedded in a mold compound; a first heat spreader partly embedded in the mold compound and thermally coupled to a first side of the semiconductor die; and a second heat spreader partly embedded in the mold compound and thermally coupled to a second side of the semiconductor die opposite the first side, wherein the first heat spreader comprises at least one heat dissipative structure protruding from a side of the first heat spreader uncovered by the mold compound and facing away from the semiconductor die, wherein the mold compound is configured to channel a fluid over the at least one heat dissipative structure in a direction parallel to the first side of the power semiconductor die.

Example 2. The molded semiconductor package of example 1, wherein: the first heat spreader further comprises one or more additional heat dissipative structures protruding from the side of the first heat spreader uncovered by the mold compound and facing away from the semiconductor die; and the mold compound is configured to channel the fluid over the one or more additional heat dissipative structures in the direction parallel to the first side of the semiconductor die.

Example 3. The molded semiconductor package of example 1 or 2, wherein the first heat spreader is disposed at a bottom side of the molded semiconductor package, wherein the at least one heat dissipative structure of the first heat spreader terminates coplanar with the mold compound at the bottom side of the molded semiconductor package, and wherein the bottom side of the molded semiconductor package is configured for mounting to a circuit board.

Example 4. The molded semiconductor package of any of examples 1 through 3, wherein the second heat spreader comprises at least one heat dissipative structure protruding from a side of the second heat spreader uncovered by the mold compound and facing away from the semiconductor die, and wherein the mold compound is configured to channel a fluid over the at least one heat dissipative structure of the second heat spreader in a direction parallel to the second side of the semiconductor die.

Example 5. The molded semiconductor package of any of examples 1 through 4, wherein the first heat spreader is disposed at a top side of the molded semiconductor package opposite a bottom side of the molded semiconductor package, wherein the at least one heat dissipative structure of the first heat spreader extends beyond the mold compound at the top side of the molded semiconductor package, and wherein the bottom side of the molded semiconductor package is configured for mounting to a circuit board.

Example 6. The molded semiconductor package of any of examples 1 through 5, wherein the first heat spreader further comprises a wall structure laterally surrounding the at least one heat dissipative structure along a periphery of the side of the first heat spreader uncovered by the mold compound and facing away from the semiconductor die.

Example 7. The molded semiconductor package of example 6, wherein the first heat spreader is disposed at a bottom side of the molded semiconductor package, wherein the wall structure of the first heat spreader terminates coplanar with the mold compound at the bottom side of the molded semiconductor package, and wherein the bottom side of the molded semiconductor package is configured for mounting to a circuit board.

Example 8. The molded semiconductor package of any of examples 1 through 7, wherein: the semiconductor die is a vertical semiconductor die having a primary current path between a first power contact pad at the first side of the vertical semiconductor die and a second power contact pad at the second side of the vertical semiconductor die; the first heat spreader is thermally coupled to the first power contact pad of the vertical semiconductor die; and the second heat spreader is thermally coupled to the second power contact pad of the vertical semiconductor die.

Example 9. The molded semiconductor package of example 8, further comprising: a first electrical redistribution structure interposed between the first heat spreader and the first power contact pad of the vertical semiconductor die, or formed as part of the first heat spreader; and a second electrical redistribution structure interposed between the second heat spreader and the second power contact pad of the vertical semiconductor die, or formed as part of the second heat spreader.

Example 10. The molded semiconductor package of any of examples 1 through 9, further comprising a metal lead extending from the second heat spreader and protruding from a side face of the mold compound.

Example 11. The molded semiconductor package of any of examples 1 through 10, wherein the first heat spreader is attached to the first side of the semiconductor die.

Example 12. The molded semiconductor package of any of examples 1 through 11, further comprising a metal clip interposed between the first heat spreader and the first side of the semiconductor die, wherein the metal clip is attached to the first side of the semiconductor die.

Example 13. The molded semiconductor package of example 12, wherein the metal clip or a lead of the metal clip protrudes from a side face of the mold compound.

Example 14. The molded semiconductor package of example 12 or 13, wherein the metal clip is attached to a metal lead at a bottom side of the molded semiconductor package, and wherein the bottom side of the molded semiconductor package is configured for mounting to a circuit board.

Example 15. The molded semiconductor package of any of examples 1 through 14, wherein the second heat spreader is disposed at a top side of the molded semiconductor package opposite a bottom side of the molded semiconductor package, wherein the second heat spreader is coplanar with the mold compound at the top side of the molded semiconductor package, and wherein the bottom side of the molded semiconductor package is configured for mounting to a circuit board, wherein the first heat spreader comprises at least one heat dissipative structure protruding from a side of the first heat spreader uncovered by the mold compound and facing away from the semiconductor die, wherein the mold compound is configured to channel a fluid over the at least one heat dissipative structure in a direction parallel to the first side of the power semiconductor die.

Example 16. An electronic assembly, comprising: a circuit board; a plurality of molded semiconductor packages each mounted at a bottom side to the circuit board, each molded semiconductor package comprising: a semiconductor die embedded in a mold compound; a first heat spreader partly embedded in the mold compound and thermally coupled to a first side of the semiconductor die; and a second heat spreader partly embedded in the mold compound and thermally coupled to a second side of the semiconductor die opposite the first side.

Example 17. The electronic assembly of example 16, wherein for each molded semiconductor package: the first heat spreader further comprises one or more additional heat dissipative structures protruding from the side of the first heat spreader uncovered by the mold compound and facing away from the semiconductor die; and the mold compound is configured to channel the fluid over the one or more additional heat dissipative structures in the direction parallel to the first side of the semiconductor die.

Example 18. The electronic assembly of example 16 or 17, wherein for each molded semiconductor package: the first heat spreader is disposed at the bottom side of the molded semiconductor package and faces the circuit board; and the second heat spreader is disposed at a top side of the molded semiconductor package opposite the bottom side and faces away from the circuit board.

Example 19. The electronic assembly of example 18, further comprising a heat sink attached to the second heat spreader of each molded semiconductor package.

Example 20. The electronic assembly of example 16 or 17, wherein for each molded semiconductor package: the second heat spreader is disposed at the bottom side of the molded semiconductor package and faces the circuit board; and the first heat spreader is disposed at a top side of the molded semiconductor package opposite the bottom side and faces away from the circuit board.

Example 21. The electronic assembly of example 20, wherein for each molded semiconductor package, the at least one heat dissipative structure of the first heat spreader is coplanar with the mold compound at the top side of the molded semiconductor package.

Example 22. The electronic assembly of example 20 or 21, further comprising a heat sink attached to a side of the circuit board that faces away from the molded semiconductor packages.

Example 23. A method of producing a molded semiconductor package, the method comprising: embedding a semiconductor die in a mold compound; thermally coupling a first heat spreader to a first side of the semiconductor die, the first heat spreader partly embedded in the mold compound; and thermally coupling a second heat spreader to a second side of the semiconductor die opposite the first side, the second heat spreader partly embedded in the mold compound, wherein the first heat spreader comprises at least one heat dissipative structure protruding from a side of the first heat spreader uncovered by the mold compound and facing away from the semiconductor die, wherein the mold compound is configured to channel a fluid over the at least one heat dissipative structure in a direction parallel to the first side of the power semiconductor die.

Example 24. The method of example 23, wherein: the first heat spreader further comprises one or more additional heat dissipative structures protruding from the side of the first heat spreader uncovered by the mold compound and facing away from the semiconductor die; and the mold compound is configured to channel the fluid over the one or more additional heat dissipative structures in the direction parallel to the first side of the semiconductor die.

Example 25. The method of example 23 or 24, wherein the first heat spreader further comprises a wall structure laterally surrounding the at least one heat dissipative structure, and wherein thermally coupling the first heat spreader to the first side of the semiconductor die comprises: before embedding the semiconductor die in the mold compound, attaching the first heat spreader to the first side of the semiconductor die or to a metal block attached to the first side of the semiconductor die, wherein the wall structure is configured to prevent liquified mold compound from flowing over the at least one heat dissipative structure of the first heat spreader during the embedding of the semiconductor die in the mold compound.

Example 26. The method of example 23 or 24, wherein thermally coupling the first heat spreader to the first side of the semiconductor die comprises: before embedding the semiconductor die in the mold compound, attaching the first heat spreader to the first side of the semiconductor die or to a metal block attached to the first side of the semiconductor die; and after embedding the semiconductor die in the mold compound, removing the mold compound from the at least one heat dissipative structure of the first heat spreader.

Example 27. The method of example 23 or 24, wherein thermally coupling the first heat spreader to the first side of the semiconductor die comprises: after embedding the semiconductor die in the mold compound, placing the first heat spreader in a cavity formed in the mold compound; and attaching the first heat spreader to the first side of the semiconductor die or to a metal block attached to the first side of the semiconductor die.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor package, comprising:
a semiconductor die embedded in a mold compound;
a first heat spreader partly embedded in the mold compound and thermally coupled to a first side of the semiconductor die;
a second heat spreader partly embedded in the mold compound and thermally coupled to a second side of the semiconductor die opposite the first side; and
a metal clip interposed between the first heat spreader and the first side of the semiconductor die,
wherein the metal clip is attached to the first side of the semiconductor die,
wherein the metal clip or a lead of the metal clip protrudes from a side face of the mold compound,
wherein the first heat spreader comprises at least one heat dissipative structure protruding from a side of the first heat spreader uncovered by the mold compound and facing away from the semiconductor die,
wherein the mold compound is configured to channel a fluid over the at least one heat dissipative structure in a direction parallel to the first side of the power semiconductor die.

2. The molded semiconductor package of claim 1, wherein:
the first heat spreader further comprises one or more additional heat dissipative structures protruding from the side of the first heat spreader uncovered by the mold compound and facing away from the semiconductor die; and
the mold compound is configured to channel the fluid over the one or more additional heat dissipative structures in the direction parallel to the first side of the semiconductor die.

3. The molded semiconductor package of claim 1, wherein the first heat spreader is disposed at a bottom side of the molded semiconductor package, wherein the at least one heat dissipative structure of the first heat spreader terminates coplanar with the mold compound at the bottom side of the molded semiconductor package, and wherein the bottom side of the molded semiconductor package is configured for mounting to a circuit board.

4. The molded semiconductor package of claim 1, wherein the second heat spreader comprises at least one heat dissipative structure protruding from a side of the second heat spreader uncovered by the mold compound and facing away from the semiconductor die, and wherein the mold compound is configured to channel a fluid over the at least one heat dissipative structure of the second heat spreader in a direction parallel to the second side of the semiconductor die.

5. The molded semiconductor package of claim 1, wherein the first heat spreader is disposed at a top side of the molded semiconductor package opposite a bottom side of the molded semiconductor package, wherein the at least one heat dissipative structure of the first heat spreader extends beyond the mold compound at the top side of the molded semiconductor package, and wherein the bottom side of the molded semiconductor package is configured for mounting to a circuit board.

6. The molded semiconductor package of claim 1, wherein the first heat spreader further comprises a wall structure laterally surrounding the at least one heat dissipative structure along a periphery of the side of the first heat spreader uncovered by the mold compound and facing away from the semiconductor die.

7. The molded semiconductor package of claim 6, wherein the first heat spreader is disposed at a bottom side of the molded semiconductor package, wherein the wall structure of the first heat spreader terminates coplanar with the mold compound at the bottom side of the molded semiconductor package, and wherein the bottom side of the molded semiconductor package is configured for mounting to a circuit board.

8. The molded semiconductor package of claim 1, wherein:
the semiconductor die is a vertical semiconductor die having a primary current path between a first power contact pad at the first side of the vertical semiconductor die and a second power contact pad at the second side of the vertical semiconductor die;
the first heat spreader is thermally coupled to the first power contact pad of the vertical semiconductor die; and
the second heat spreader is thermally coupled to the second power contact pad of the vertical semiconductor die.

9. The molded semiconductor package of claim 8, further comprising:
a first electrical redistribution structure interposed between the first heat spreader and the first power contact pad of the vertical semiconductor die, or formed as part of the first heat spreader; and
a second electrical redistribution structure interposed between the second heat spreader and the second power contact pad of the vertical semiconductor die, or formed as part of the second heat spreader.

10. The molded semiconductor package of claim 1, further comprising a metal lead extending from the second heat spreader and protruding from a side face of the mold compound.

11. The molded semiconductor package of claim 1, wherein the first heat spreader is attached to the metal clip.

12. The molded semiconductor package of claim 1, wherein the metal clip is attached to a metal lead at a bottom side of the molded semiconductor package, and wherein the bottom side of the molded semiconductor package is configured for mounting to a circuit board.

13. The molded semiconductor package of claim 1, wherein the second heat spreader is disposed at a top side of the molded semiconductor package opposite a bottom side of the molded semiconductor package, wherein the second heat spreader is coplanar with the mold compound at the top side of the molded semiconductor package, and wherein the bottom side of the molded semiconductor package is configured for mounting to a circuit board.

14. An electronic assembly, comprising:
a circuit board; and
a plurality of molded semiconductor packages according to claim 1 and mounted at a bottom side to the circuit board.

15. The electronic assembly of claim 14, further comprising a heat sink attached to the second heat spreader of each of the plurality of molded semiconductor packages.

16. The electronic assembly of claim 14, further comprising a heat sink attached to a side of the circuit board that faces away from the plurality of molded semiconductor packages.

17. A method of producing a molded semiconductor package, the method comprising:
embedding a semiconductor die in a mold compound;
thermally coupling a first heat spreader to a first side of the semiconductor die, the first heat spreader partly embedded in the mold compound; and
thermally coupling a second heat spreader to a second side of the semiconductor die opposite the first side, the second heat spreader partly embedded in the mold compound,
wherein thermally coupling the first heat spreader to the first side of the semiconductor die comprises attaching the first heat spreader to the first side of the semiconductor die or to a metal block attached to the first side of the semiconductor die before embedding the semiconductor die in the mold compound,
wherein the first heat spreader comprises at least one heat dissipative structure protruding from a side of the first heat spreader uncovered by the mold compound and facing away from the semiconductor die,
wherein the first heat spreader comprises a wall structure laterally surrounding the at least one heat dissipative structure,
wherein the wall structure is configured to prevent liquified mold compound from flowing over the at least one heat dissipative structure of the first heat spreader during the embedding of the semiconductor die in the mold compound,
wherein the mold compound is configured to channel a fluid over the at least one heat dissipative structure in a direction parallel to the first side of the power semiconductor die.

18. The method of claim 17, wherein:
the first heat spreader further comprises one or more additional heat dissipative structures protruding from the side of the first heat spreader uncovered by the mold compound and facing away from the semiconductor die; and
the mold compound is configured to channel the fluid over the one or more additional heat dissipative structures in the direction parallel to the first side of the semiconductor die.

19. The method of claim 17, wherein thermally coupling the first heat spreader to the first side of the semiconductor die comprises:
after embedding the semiconductor die in the mold compound, removing the mold compound from the at least one heat dissipative structure of the first heat spreader.

20. The method of claim 17, wherein thermally coupling the first heat spreader to the first side of the semiconductor die comprises:
after embedding the semiconductor die in the mold compound, placing the first heat spreader in a cavity formed in the mold compound; and
attaching the first heat spreader to the first side of the semiconductor die or to a metal block attached to the first side of the semiconductor die.

21. A molded semiconductor package, comprising:
a semiconductor die embedded in a mold compound;
a first heat spreader partly embedded in the mold compound and thermally coupled to a first side of the semiconductor die;
a second heat spreader partly embedded in the mold compound and thermally coupled to a second side of the semiconductor die opposite the first side; and
a metal clip interposed between the first heat spreader and the first side of the semiconductor die,
wherein the metal clip is attached to the first side of the semiconductor die,
wherein the metal clip is attached to a metal lead at a bottom side of the molded semiconductor package,
wherein the bottom side of the molded semiconductor package is configured for mounting to a circuit board, wherein the first heat spreader comprises at least one heat dissipative structure protruding from a side of the first heat spreader uncovered by the mold compound and facing away from the semiconductor die, wherein the mold compound is configured to channel a fluid over the at least one heat dissipative structure in a direction parallel to the first side of the power semiconductor die.

22. A molded semiconductor package, comprising:
a semiconductor die embedded in a mold compound;
a first heat spreader partly embedded in the mold compound and thermally coupled to a first side of the semiconductor die; and
a second heat spreader partly embedded in the mold compound and thermally coupled to a second side of the semiconductor die opposite the first side,
wherein the first heat spreader comprises at least one heat dissipative structure protruding from a side of the first heat spreader uncovered by the mold compound and facing away from the semiconductor die,
wherein the second heat spreader is disposed at a top side of the molded semiconductor package opposite a bottom side of the molded semiconductor package,
wherein the second heat spreader is coplanar with the mold compound at the top side of the molded semiconductor package,
wherein the bottom side of the molded semiconductor package is configured for mounting to a circuit board, and
wherein the mold compound is configured to channel a fluid over the at least one heat dissipative structure in a direction parallel to the first side of the power semiconductor die.

23. A method of producing a molded semiconductor package, the method comprising:
embedding a semiconductor die in a mold compound;
thermally coupling a first heat spreader to a first side of the semiconductor die, the first heat spreader partly embedded in the mold compound; and
thermally coupling a second heat spreader to a second side of the semiconductor die opposite the first side, the second heat spreader partly embedded in the mold compound,
wherein thermally coupling the first heat spreader to the first side of the semiconductor die comprises:
before embedding the semiconductor die in the mold compound, attaching the first heat spreader to the first side of the semiconductor die or to a metal block attached to the first side of the semiconductor die; and
after embedding the semiconductor die in the mold compound, removing the mold compound from the at least one heat dissipative structure of the first heat spreader,
wherein the first heat spreader comprises at least one heat dissipative structure protruding from a side of the first heat spreader uncovered by the mold compound and facing away from the semiconductor die,
wherein the mold compound is configured to channel a fluid over the at least one heat dissipative structure in a direction parallel to the first side of the power semiconductor die.

24. A method of producing a molded semiconductor package, the method comprising:
embedding a semiconductor die in a mold compound;
thermally coupling a first heat spreader to a first side of the semiconductor die, the first heat spreader partly embedded in the mold compound; and
thermally coupling a second heat spreader to a second side of the semiconductor die opposite the first side, the second heat spreader partly embedded in the mold compound,
wherein thermally coupling the first heat spreader to the first side of the semiconductor die comprises:
after embedding the semiconductor die in the mold compound, placing the first heat spreader in a cavity formed in the mold compound; and
attaching the first heat spreader to the first side of the semiconductor die or to a metal block attached to the first side of the semiconductor die,
wherein the first heat spreader comprises at least one heat dissipative structure protruding from a side of the first heat spreader uncovered by the mold compound and facing away from the semiconductor die,
wherein the mold compound is configured to channel a fluid over the at least one heat dissipative structure in a direction parallel to the first side of the power semiconductor die.

* * * * *